US006946876B2

(12) United States Patent
Isezaki et al.

(10) Patent No.: US 6,946,876 B2
(45) Date of Patent: Sep. 20, 2005

(54) SEMICONDUCTOR INTEGRATED CIRCUIT DEVICE AND ELECTRONIC SYSTEM

(75) Inventors: Takeshi Isezaki, Ome (JP); Toshiro Takahashi, Hamura (JP)

(73) Assignee: Hitachi, Ltd., Tokyo (JP)

( * ) Notice: Subject to any disclaimer, the term of this patent is extended or adjusted under 35 U.S.C. 154(b) by 6 days.

(21) Appl. No.: 10/705,858

(22) Filed: Nov. 13, 2003

(65) Prior Publication Data

US 2004/0094779 A1 May 20, 2004

(30) Foreign Application Priority Data

Nov. 13, 2002 (JP) ........................................ 2002-329401

(51) Int. Cl.[7] ........................................... H03K 19/175
(52) U.S. Cl. ............................. 326/80; 326/81; 326/62; 326/63; 327/333; 327/407
(58) Field of Search .............................. 326/80, 81, 62, 326/63, 22, 26; 327/333, 415, 403, 530, 535, 538, 544, 407

(56) References Cited

U.S. PATENT DOCUMENTS

| | | | | |
|---|---|---|---|---|
| 5,712,586 A | * | 1/1998 | Kitao | ........................ 327/333 |
| 6,087,885 A | | 7/2000 | Tobita | |
| 6,456,147 B1 | * | 9/2002 | Kohamada | .................. 327/407 |

FOREIGN PATENT DOCUMENTS

JP    11-150469    6/1999

OTHER PUBLICATIONS

International Semiconductor Technology Roadmap, 1999, (no translation), no month.

* cited by examiner

Primary Examiner—Vibol Tan
(74) Attorney, Agent, or Firm—Mattingly, Stanger, Malur & Brundidge, P.C.

(57) ABSTRACT

Noise of a low frequency band, generated inside a logic circuit, is remarkably reduced. A semiconductor integrated circuit device is provided with: a high voltage supply circuit generating, from a high voltage external power supply that is externally input, a high voltage internal power supply having a certain voltage level; and a low voltage supply circuit generating, from a low voltage external power supply that is externally input, a low voltage internal power supply having a certain voltage level. In inputting/outputting a signal between a logic circuit block and an I/O unit, a signal level is shifted through a level shifter unit. Since the logic circuit block is operated by the high voltage internal power supply and the low voltage internal power supply, the inductance in the semiconductor integrated circuit device is not subjected directly to DC fluctuation in consumed currents. Therefore, the characteristic impedance of power supply becomes equivalently smaller, thereby reducing low frequency noise.

11 Claims, 9 Drawing Sheets

SEMICONDUCTOR INTEGRATED CIRCUIT DEVICE AND ELECTRONIC SYSTEM

BACKGROUND OF THE INVENTION

The present invention relates to a technique of reducing noise in a semiconductor integrated circuit device and, particularly, to a technique effectively applied to reducing noise of low frequency band generated through DC fluctuations in a logic circuit.

As semiconductor devices are miniaturized, high integration and high-speed processing of semiconductor integrated circuit devices are more and more progressing and there is the trend to increase in consumed currents with the progression. For example, according to the International Semiconductor Technology Roadmap of 1999, there is a possibility that the operating frequency of high performance MPUs will become 6.7 times and the consumed currents 5.2 times more than those in the coming 10 years. Meanwhile, there is a possibility that supply voltages will become approximately ⅓ as much as the present ones because cuts in the supply voltages advance for restricting power consumption.

Now, the supply noise in the semiconductor circuit integrated device is roughly divided into a high frequency band and a low frequency band. The noise of the high frequency band is generated, due to a leak current momentarily flowing through a logic gate of the semiconductor integrated circuit device when the logic gate is operated synchronously with internal clock signals.

The magnitude of the noise of the high frequency band is obtained, by dividing a time-integrated value of AC fluctuation of the consumed currents in the semiconductor integral circuit device by a supply capacitor within a semiconductor chip. As noted above, although the consumed currents of the semiconductor integrated circuit device is probably increased, the noise of the high frequency band can be kept substantially constant by utilizing unused transistor regions or the like in the semiconductor chip and increasing the supply capacitor.

The noise of the low frequency band is also generated, due to resonance phenomena caused by the inductance of a package and the supply capacitor in the semiconductor chip. The magnitude thereof is proportional to DC fluctuations in the consumed current of the semiconductor integrated circuit device and the characteristic impedance of power source.

To reduce the noise of the low frequency band, it is necessary to take measures, such as reduction in the characteristic impedance of the power supply (for example, see Patent Document 1). However, the noise of the low frequency band is out of the question since the magnitude thereof is extremely small as compared to that of the high frequency band.

[Patent Document 1]
Japanese Patent Laid-open No. 11-150469

SUMMARY OF THE INVENTION

However, the present inventors have found the following problems about the above-mentioned semiconductor integrated circuit device.

More particularly, since the supply voltage is reduced with power cuts in the semiconductor integrated circuit device, the ratio of the noise of the low frequency band to the supply voltage becomes large and, therefore, there is the drawback of harming operations of the semiconductor integrated circuit device in the future.

Moreover, as the supply voltage of the semiconductor integrated circuit device is reduced and the consumed currents are increased, the supply voltage drop, owing to resistance in power supply wires and the like, increases a ratio occupied by the power supply. This further anticipates that a desired amount of voltage is difficult to apply to an input/output circuit or logic circuit of the semiconductor integrated circuit device.

An object of the present invention is to provide a semiconductor integrated circuit device and an electronic system, which are capable of considerably reducing the low frequency band noise generated through DC fluctuations of the consumed current in operating the logic circuit.

Another object of the present invention is to provide a semiconductor integrated circuit device and an electronic system, which are capable of considerably reducing the supply voltage drop owing to power supply resistance depending on the reduction in the supply voltage.

The above or other objects and novel features will be appear from the description of the present specification and the accompanying drawings.

The outlines of representative ones among the inventions disclosed in the present application will be briefly described as follows.

(1) A semiconductor integrated circuit device comprises: an internal supply generating means for generating, from an external supply voltage that is externally input, an internal supply voltage at which a logic circuit is operated; and a level shift means for shift a voltage amplitude level of a signal input to and output from the logic circuit.

Also, outline of another invention of the present application will be briefly described.

(2) In item (1), the internal supply generating means includes: a high voltage supply generating unit for generating a high voltage internal power supply from a high voltage external power supply of the external supply voltage; and a low voltage supply generating unit for generating a low voltage internal power supply from a low voltage external power supply of the external supply voltage.

(3) In item (2), the high voltage supply generating unit includes: a first voltage comparing unit comparing voltage levels of a first reference voltage and a high voltage internal power supply generated by the high voltage supply generating unit, and outputting a first internal control signal changing its voltage in accordance with a difference between the voltage levels; and a first internal supply generating unit having a structure in which a plurality of power supply transistors are connected in parallel between the high voltage external power supply and the high voltage internal power supply, and the low voltage supply generating unit includes: a second voltage comparing unit comparing voltage levels of a second reference voltage and a low voltage internal power supply generated by the low voltage supply generating unit, and outputting a second internal control signal changing its voltage in accordance with a difference between the voltage levels; and a second internal supply generating unit having a structure in which a plurality of power supply transistors are connected in parallel between the low voltage external power supply and the low voltage internal power supply and the second internal control signal, output by the second voltage comparing unit, is input to each gate of the plurality of power supply transistors, and driving the plurality of power supply transistors in accordance with said second internal control signal.

(4) In item (2), the high voltage supply generating unit includes: a first voltage comparing unit comparing voltage levels of a first reference voltage and a high voltage internal power supply generated by said high voltage supply generating unit, and outputting a first internal control signal changing its voltage in accordance with a difference between the voltage levels; and a first internal supply controlling unit provided with a first duty control circuit, which generates a pulse signal having an arbitrary duty ratio in accordance with a first internal control signal output from said first voltage comparing unit, and with a plurality of power supply transistors, which are connected in parallel between said high voltage external power supply and the high voltage internal power supply and to each gate of which a pulse signal, output from the first duty control circuit, and the low voltage supply generating unit includes:

a second voltage comparing unit comparing voltage levels of a second reference voltage and a low voltage internal power supply generated by the low voltage supply generating unit, and outputting a second-internal control signal changing its voltage in accordance with a difference between the voltage levels; and a second internal supply controlling unit provided with a second duty control circuit, which generates a pulse signal having an arbitrary duty ratio in accordance with a second internal control signal output from the second voltage comparing unit, and with a plurality of power supply transistors, which are connected in parallel between the low voltage external power supply and said low voltage internal power supply and to each gate of which a pulse signal, output from the second duty control circuit, is input.

(5) In item (3) or (4), the first and second voltage comparing units stopping the plurality of power supply transistors in accordance with a input setting signal, and electrically separate the high voltage external power supply and the high voltage internal power supply, as well as the low voltage external power supply and the low voltage internal power supply, respectively.

(6) In item (5), the high voltage supply generating unit includes: a first transistor connected between the high voltage internal power supply and the high voltage external power supply, and conducted when the first voltage comparing unit electrically separates the high voltage external power supply and the high voltage internal power supply in accordance with a control signal, and the low voltage supply generating unit includes: a second transistor connected between the low voltage internal power supply and the low voltage external power supply, and conducted when the second voltage comparing unit electrically separates the low voltage external power supply and the low voltage internal power supply in accordance with a control signal.

(7) In any one of items (1) to (6), an ESD protection device, serving as a supply capacitor, is provided between internal supply voltages generated by the internal supply generating unit.

(8) In any one of items (1) to (7), each of the first internal supply controlling unit, the second internal supply controlling unit, and the ESD protection device is provided two or more in number, thereby being dispersedly disposed on a semiconductor chip.

(9) In any one of item (2) to (8), a reference voltage generating unit for generating the first and second reference voltages is provided.

(10) In any one of item (1) to (9), the level shifter includes: a first level shift unit shifting, into a signal amplitude of an external supply voltage level, a signal amplitude of an internal supply voltage level output from the logic circuit, and a second level shift unit shifting, into a signal amplitude of an internal supply voltage level at which the logic circuit is operated, a signal amplitude of an external supply voltage level having been input externally.

(11) An electronic system comprising: a semiconductor integrated circuit device including an internal supply voltage generating means for generating, from an external supply voltage that is externally input, an internal supply voltage at which a logic circuit is operated; and an electronic component mounting board for mounting the semiconductor integrated circuit device.

(12) In item (11), the internal supply voltage generating means includes: a high voltage supply generating unit generating a high voltage internal power supply, from a high voltage external power supply of an external supply voltage supplied through a power supply wire formed on said electronic component mounting board; and a low voltage supply generating unit generating a low voltage internal power supply, from a low voltage external power supply of an external supply voltage supplied through a power supply wire formed on said electronic component mounting board.

(13) In item (12), the high voltage supply generating unit includes: a first voltage comparing unit comparing voltage levels of a first reference voltage and a high voltage internal power supply generated by the high voltage supply generating unit, and outputting a first internal control signal changing its voltage in accordance with a difference between the voltage levels; and a first internal supply controlling unit having a structure in which a plurality of power supply transistors are connected in parallel between the high voltage external power supply and the high voltage internal power supply and said high voltage internal power supply and a first internal control signal, output by the first voltage comparing unit, is input to each gate of the plurality of power supply transistors, and driving the plurality of power supply transistors in accordance with the first internal control signal to generate the high voltage internal power supply, and the low voltage supply generating unit includes:

a second voltage comparing unit comparing voltage levels of a second reference voltage and a low voltage internal power supply generated by the low voltage supply generating unit, and outputting a second internal control signal changing its value in accordance with a difference between the voltage levels; and a second internal supply controlling unit having a structure in which a plurality of power supply transistors are connected in parallel between the low voltage external power supply and the low voltage internal power supply and the second internal control signal, output by the second voltage comparing unit, is input to each gate of the plurality of power supply transistors, and driving the plurality of power supply transistors in accordance with said second internal control signal to generate the low voltage internal power supply.

DESCRIPTION OF THE PREFERRED EMBODIMENTS

Embodiments of the present invention will be described below and in detail based on the drawings.

Figure 1:
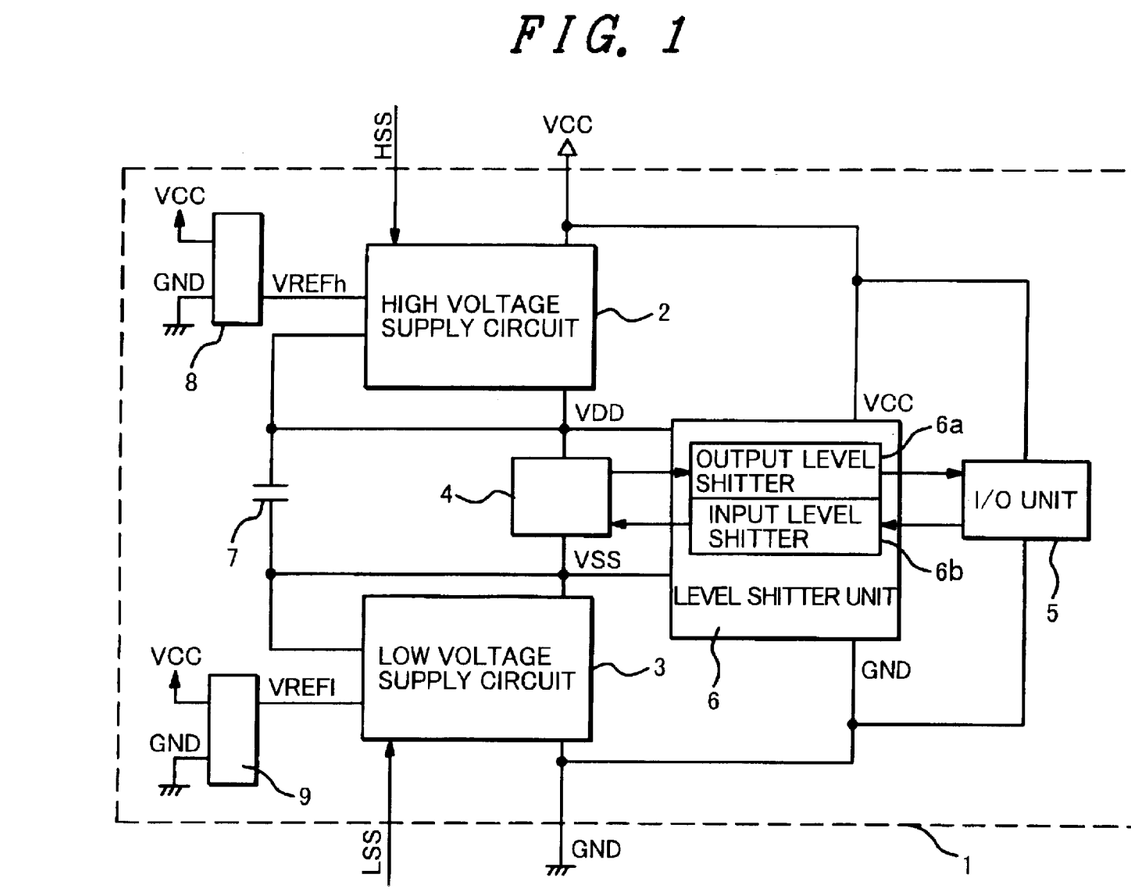
FIG. 1 is a block view of a semiconductor integrated circuit device according to an embodiment of the present embodiment.
Figure 2:
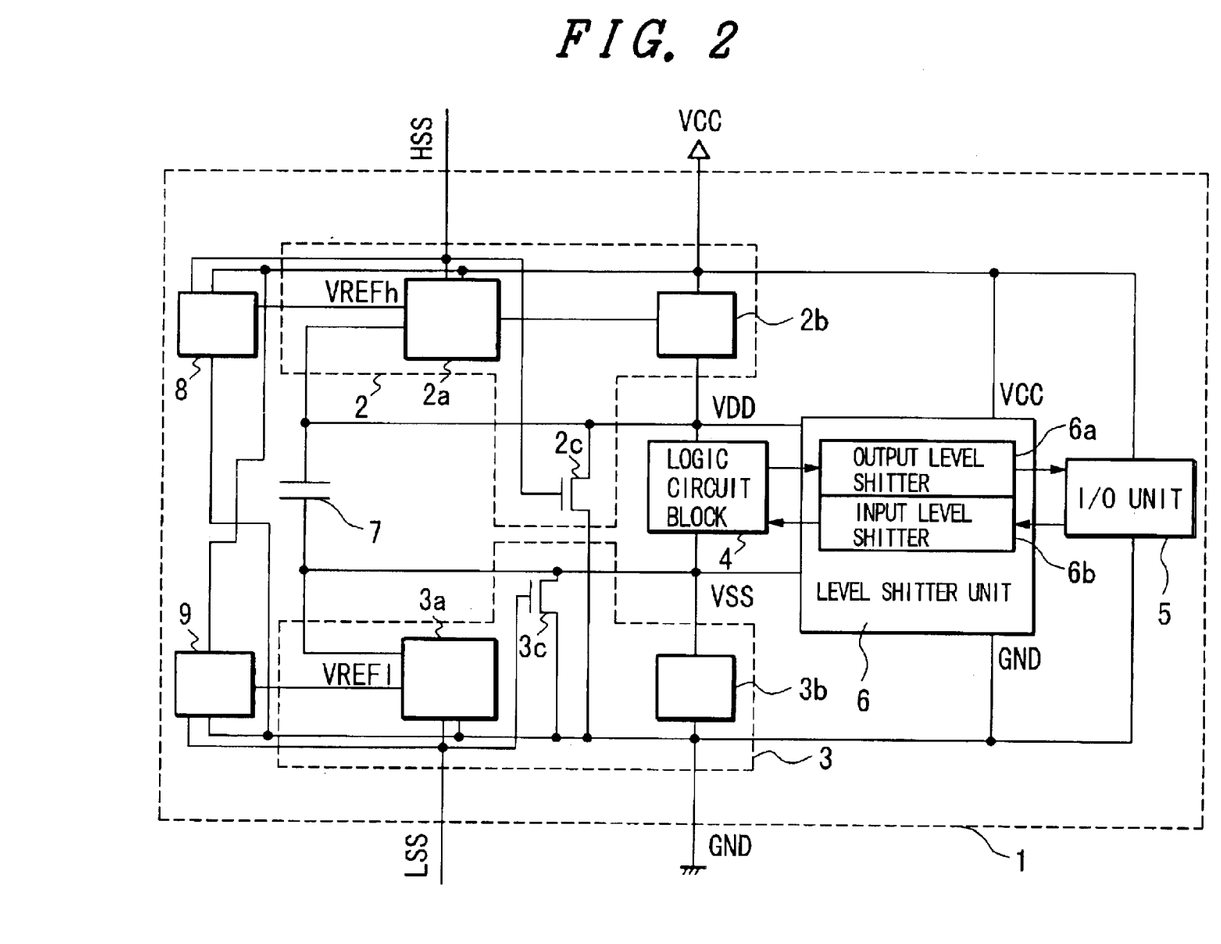
FIG. 2 is an explanatory view of a function block in the semiconductor integrated circuit device of FIG. 1.
Figure 3:
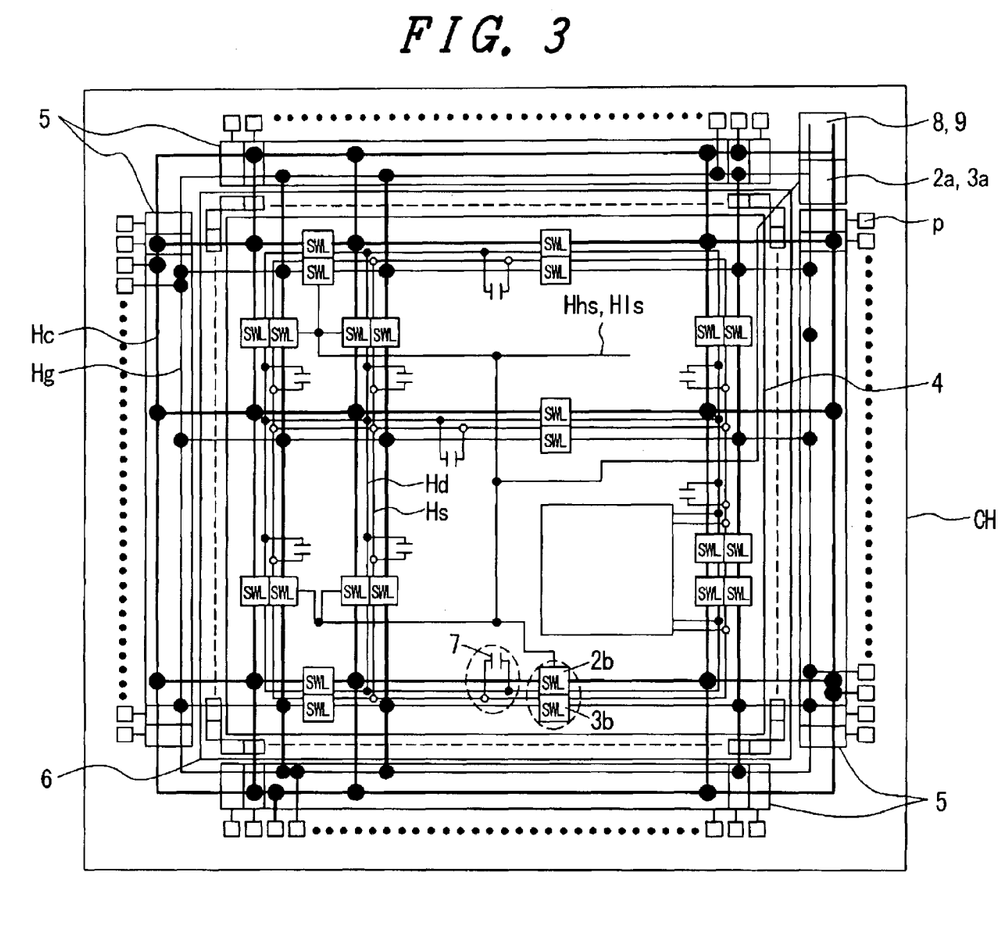
FIG. 3 is a chip layout diagram in the semiconductor integrated circuit device of FIG. 1.
Figure 4:
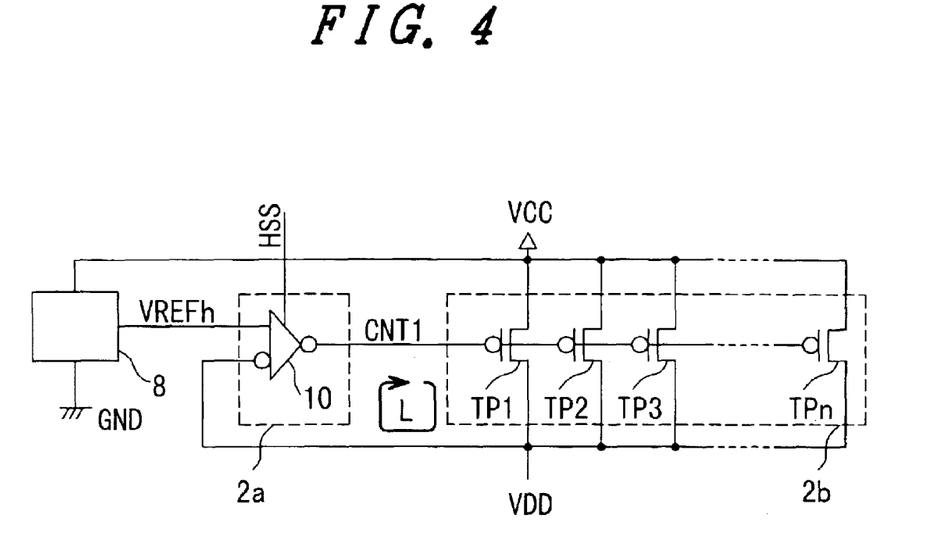
FIG. 4 is a circuit view of a high voltage supply circuit provided in the semiconductor integrated circuit device of FIG. 1.
Figure 5:
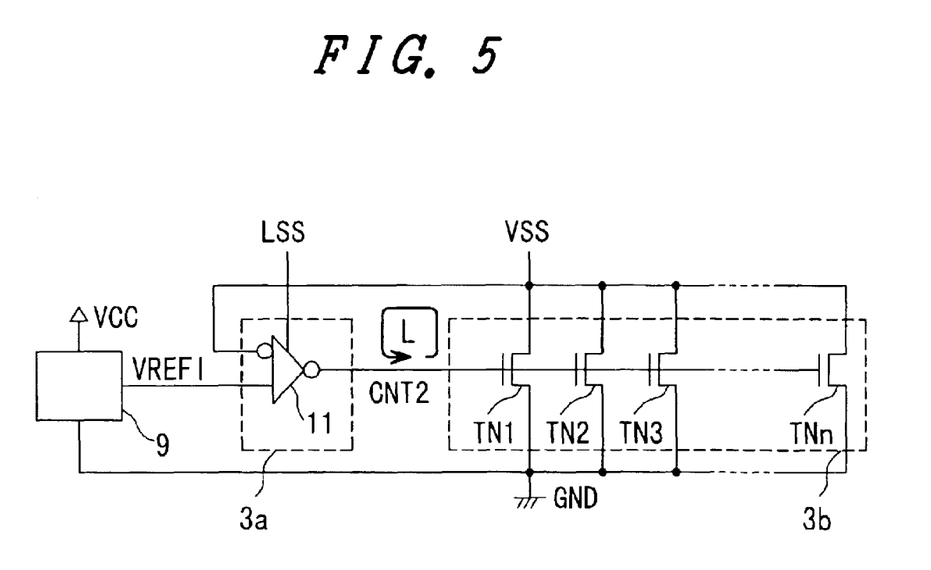
FIG. 5 is a circuit view of a low voltage supply circuit provided in the semiconductor integrated circuit device of FIG. 1.
Figure 6:
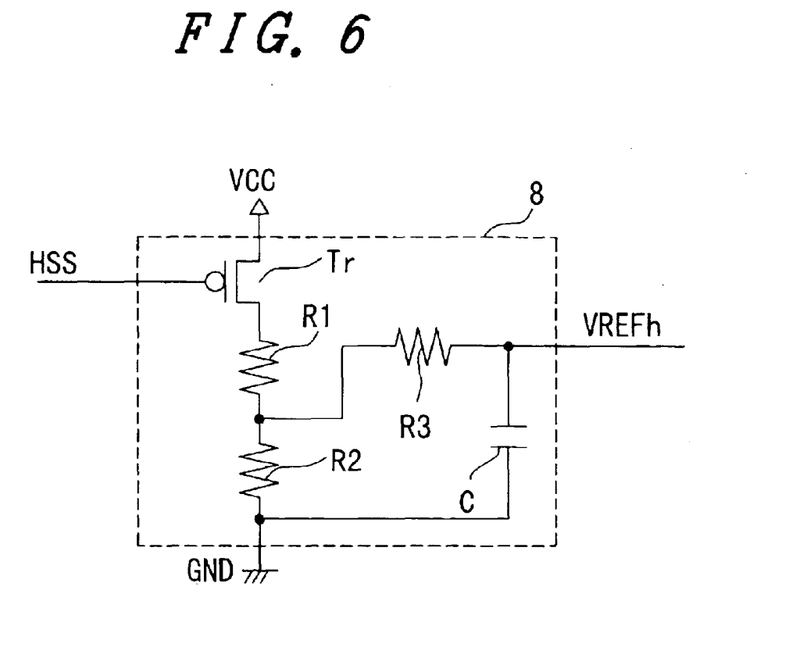
FIG. 6 is a circuit view of a high reference voltage circuit provided in the semiconductor integrated circuit device of FIG. 1.
Figure 7:
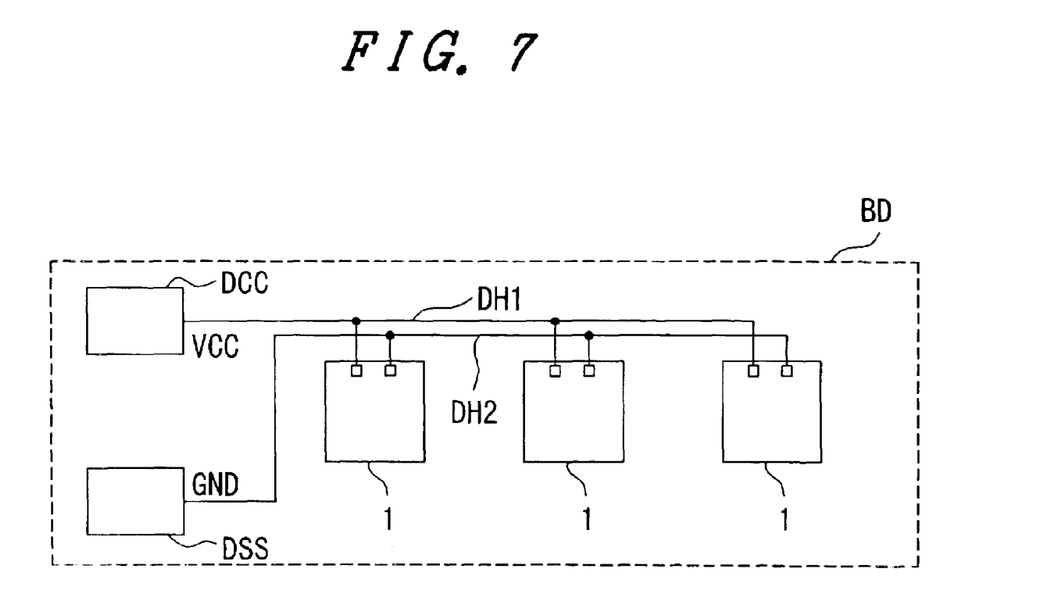
FIG. 7 is an explanatory view illustrating one example in which the semiconductor integrated circuit device of FIG. 1 is mounted onto a board.
Figure 8:
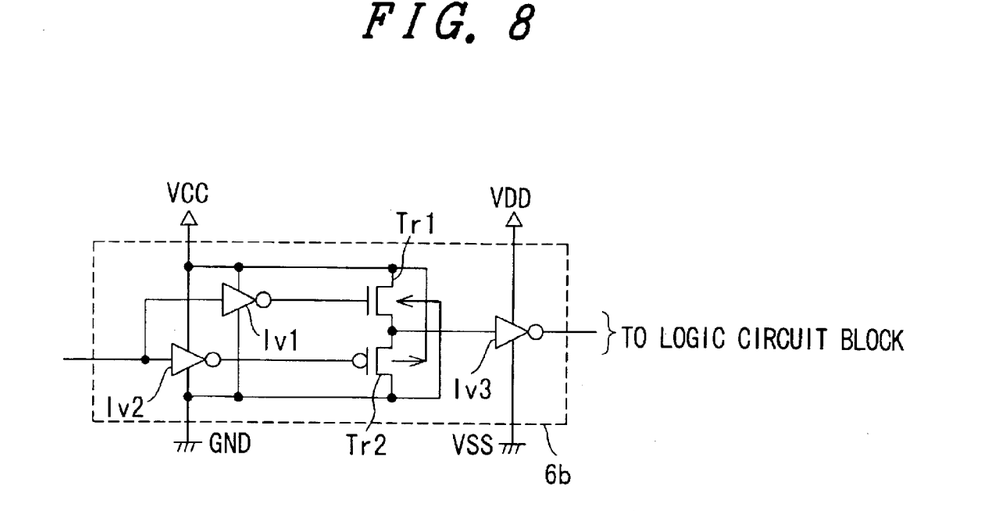
FIG. 8 is a circuit view of an input level shifter provided in the semiconductor integrated circuit device of FIG. 1.
Figure 9:
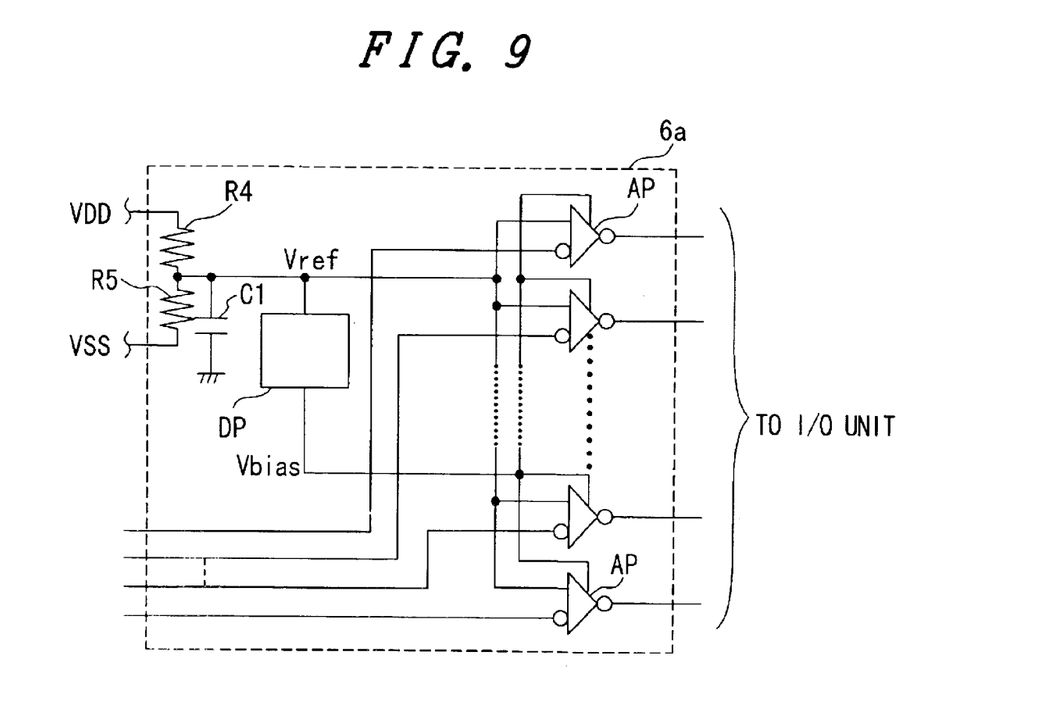
FIG. 9 is a circuit view of an output level shifter provided in the semiconductor integrated circuit device of FIG. 1.

FIG. 1 is a block view of a semiconductor integrated circuit device according to an embodiment of the present embodiment; FIG. 2 is an explanatory view of a function block in the semiconductor integrated circuit device of FIG. 1; FIG. 3 is a chip layout diagram in the semiconductor integrated circuit device of FIG. 1; FIG. 4 is a circuit view of a high voltage supply circuit provided in the semiconductor integrated circuit device of FIG. 1; FIG. 5 is a circuit view of a low voltage supply circuit provided in the semiconductor integrated circuit device of FIG. 1; FIG. 6 is a circuit view of a high reference voltage circuit provided in the semiconductor integrated circuit device of FIG. 1; FIG. 7 is an explanatory view illustrating one example in which the semiconductor integrated circuit device of FIG. 1 is mounted onto a board; FIG. 8 is a circuit view of an input level shifter provided in the semiconductor integrated circuit device of FIG. 1; and FIG. 9 is a circuit view of an output level shifter provided in the semiconductor integrated circuit device of FIG. 1.

According to the present embodiment, a semiconductor integrated circuit device 1 comprises, as illustrated in FIG. 1, a high voltage supply circuit (internal supply generating means) 2, a low voltage supply circuit (internal supply generating means) 3, a logic circuit block (logic circuit) 4, an I/O unit 5, a level shifter unit 6, an ESD protection device 7, a high reference voltage circuit 8, and a low reference voltage circuit 9, etc.

The high voltage supply circuit 2 generates high voltage internal power supply (internal supply voltage) VDD having a certain voltage level, from high voltage external power supply (external supply voltage) VCC that is externally input. The low voltage supply circuit 3 generates low voltage internal power supply (internal supply voltage) VSS having a certain voltage level, from low voltage external power supply (external supply voltage) GND that is externally input together with the high voltage external power supply VCC.

The high voltage external power supply VCC and low voltage external al power supply GND are connected such that those are respectively supplied to the I/O unit 5, the level shifter unit (level shifter) 6, the high reference voltage circuit 8 and the low reference voltage circuit 9 in addition to the high voltage supply circuit 2 and low voltage supply circuit 3.

The high voltage internal power supply VDD and low voltage internal power supply VSS, generated through the high voltage supply circuit 2 and low voltage supply circuit 3, are further connected such that those are respectively supplied to the logic circuit block 4 and the level shifter unit 6.

The high voltage supply circuit 2 and low voltage supply circuit 3 are connected such that a high voltage setting signal (first control signal) HSS and a low voltage setting signal (second control signal) LSS are respectively input externally. When the high voltage setting signal HSS is input, the high voltage supply circuit 2 terminates its operations and the high voltage external power supply VCC and the high voltage internal power supply VDD are electrically disconnected. Similarly, when the low voltage setting signal LSS is input, the low voltage supply circuit 3 terminates its operations and the low voltage external power supply GND and the low voltage internal power supply VSS are electrically disconnected.

In this case, there is adopted the structure in which the high voltage setting signal HSS and the low voltage setting signal LSS are externally input. However, there may be adopted the structure of providing circuits for respectively generating the high voltage setting signal HSS and the low voltage setting signal LSS inside the semiconductor integrating circuit device 1.

The logic circuit block 4 comprises a CPU (Central Processing Unit), a peripheral circuit such as a RAM (Random Access Memory) or a D/A converter, and the like. The I/O (Input/Output) unit 5 is an input/output circuit for data or the like. The level shifter unit 6 comprises an output level shifter (first level shift unit) 6a and an input level shifter (second level shift unit) 6b.

The output level shifter 6a converts an output signal of a logic high voltage (high voltage internal power supply VDD) or logic low voltage (low voltage internal power supply VSS), which is output from the logic circuit unit 4, to a lever of the high voltage external power supply VCC or low voltage external power supply GND, respectively, and thereafter outputs the converted level.

The input level shifter 6b converts an input signal having the level of the high voltage external power supply VCC or low voltage external power supply GND, which is output externally, to a logic high voltage (high voltage internal power supply VDD) or logic low voltage (low voltage internal power supply VCC) of the logic circuit block 4, respectively, and thereafter outputs the converted voltage to the logic circuit block 4.

The input level shifter 6b converts an input signal having a level range of the externally output high voltage external power supply VCC to the low voltage external power supply GND, to an output signal having a level range of the high voltage internal power supply VDD to the low voltage internal power supply VSS, and outputs the converted output signal to the logic circuit block 4.

The ESD protection device 7 is a supply capacitor connected between the high voltage internal power supply VDD and the low voltage internal power supply VSS. The high reference voltage circuit 8 generates a high reference voltage (first reference voltage) VREFh from the high voltage external power supply VCC and the low voltage external power supply GND. The low reference voltage circuit 9 generates a low reference voltage (second reference voltage) VREFl from the high voltage external power supply VCC and the low voltage external power supply GND.

The high reference voltage VREFh is used when the high voltage supply circuit 2 generates the high voltage internal power supply VDD, and the low reference voltage circuit 9 is used when the low voltage supply circuit 3 generates the low voltage internal power supply VSS.

The high voltage internal power supply VDD has substantially the same voltage as the high reference voltage VREFh, and the low voltage internal power supply VSS has substantially the same as the low reference voltage VREFl. Accordingly, to stabilize the supply voltage level of the logic circuit block 4, the high reference voltage VREFh and the low reference voltage VREFl must be stabilized. Also, the VCC and GND, serving as the respective power supplies of the high reference voltage circuit 8 and low reference voltage circuit 9, are desirably stabilized. Though not illustrated, the respective power supplies of the high reference voltage circuit 8 and low reference voltage circuit 9 may be supplied from the outside by providing the semiconductor integrated circuit device 1 with exclusive terminals.

Not that the above description has been made of the case where the supply voltage levels, at which the logic circuit block 4 is operated, are the same, but if a plurality of logic circuit blocks 4 are provided and their supply voltage levels are different, then the high voltage supply circuit 2, low voltage supply circuit 3, and I/O unit 5 are respectively provided up to the number equal to that of different power supply levels.

Also, FIG. 2 illustrates a function block of the semiconductor integrated circuit device 1.

In FIG. 2, the high voltage supply circuit 2 comprises: a high voltage internal supply generating unit (high voltage generating means, first internal supply generating unit, first voltage comparing unit) 2a; a high voltage internal supply controlling unit (high voltage generating means, first internal supply controlling unit) 2b; and a transistor (high voltage generating means, first transistor) 2c.

The low voltage supply circuit 3 comprises: a low voltage internal supply generating unit (low voltage generating unit, second internal supply generating unit, second voltage comparing unit) 3a; a low voltage internal supply controlling unit (low voltage generating means, second internal supply controlling unit) 3b; and a transistor (low voltage generating means, second transistor) 3c.

The high voltage internal supply generating unit 2a is connected such that the high voltage setting signal HSS and high reference voltage VREFh are respectively input thereto. The low voltage internal supply generating unit 3a is connected such that the low voltage setting signal LSS and low reference voltage VREFl are respectively input thereto.

The transistors 2c and 3c each comprise an N channel MOS, and gates of the transistors 2c and 3c are connected such that the high voltage setting signal HSS and low voltage setting signal LSS are respectively input thereto.

The high voltage internal power supply VDD is connected to one connection of the transistor 2c while the low voltage external power supply GND is connected to the other connection thereof. Further, the low voltage internal power supply VSS is connected to one connection of the transistor 3c while the low voltage external power supply GND is connected to the other connection thereof.

As described above, the high voltage supply circuit 2 and low voltage supply circuit 3 terminate their operations when the high voltage setting signal HSS and low voltage setting signal LSS are respectively input.

When the respective operations of the high voltage supply circuit 2 and low voltage supply circuit 3 terminate, the transistors 2c and 3c respectively receive the high voltage setting signal HSS and low voltage setting signal LSS to be switched on and the high voltage internal power supply VDD and the low voltage internal power supply VSS are set to the level of the low voltage external power supply GND.

FIG. 3 is a layout view of a semiconductor chip CH in the semiconductor integrated circuit device 1.

As illustrated, the I/O units 5 are provided on a peripheral portion of the semiconductor chip CH, and the logic circuit block 4 is provided in each of them. The high reference voltage circuit 8 and low reference voltage circuit 9 are provided in an empty region of the I/O unit 5 located at the upper-right corner or the like.

The high voltage internal supply generating unit 2a and low voltage internal supply generating unit 3a are respectively provided in the vicinity of the high reference voltage circuit 8 and low reference voltage circuit 9. The high reference voltage circuit 8 and the low reference voltage circuit 9 are desirably disposed extremely close to the high voltage internal supply generating unit 2a and the low voltage internal supply generating unit 3a. The level shifter unit 6 is provided between the logic circuit block 4 and the I/O units 5.

In the logic circuit block 4, each plurality of high voltage internal supply controlling units 2b, low voltage internal supply controlling units 3b, and ESD protection devices 7 are dispersed and disposed. Additionally, a drive current required for operating the logic circuit block 4 is supplied from charges stored in the ESD protection devices 7, thereby allowing suppressing the supply voltage drop caused due to the resistances of power supply wires.

A plurality of pads P, serving as internal electrodes, are disposed on the outer peripheral portion of the semiconductor chip CH. Each pad P is a terminal to which the I/O unit 5, externally input high voltage external power supply VCC, low voltage external power supply GND, or the like is connected.

In the semiconductor chip CH, further, power supply wires Hc, Hg, Hd, and Hs and wirings Hhs and Hls are formed, respectively. These power supply wires Hc, Hg, Hd, and Hs and the wirings Hhs and Hls are disposed in a mesh-like manner.

The power supply wire Hc supplies the high voltage external power supply VCC to the high voltage supply circuits 2a and 2b, I/O units 5, and level shifter units 6, etc. The power supply wire Hg supplies the low voltage external power supply GND to the low voltage supply circuits 3a and 3b, I/O units 5, and level shifter units 6, etc.

The power supply wire Hd supplies the high voltage internal power supply VDD to each of the logic circuit block 4 and level shifter units 6. The power supply wire Hs supplies the low voltage internal power supply VSS to each of the logic circuit block 4 and level shifter units 6.

The wiring Hhs supplies the high voltage setting signal HSS to the high voltage internal supply controlling unit 2b, and the wiring Hls supplies the low voltage setting signal LSS to the low voltage supply controlling unit 3b.

The relationship between the supply voltage and the potential of the signal will now be explained.

The high voltage internal power supply VDD is lower than the high voltage external power supply VCC (VDD<VCC), and is equal to the high reference voltage VREFh (VDD=VREFh). The low voltage internal power supply VSS is higher than the low voltage external power supply GND (VSS>GND), and is equal to the low reference voltage VREFl (VSS=VREFl).

Further, a logic high potential Vlh of the signals, which are input to the logic circuit block 4 from the input level shifter 6b and is output from the logic circuit block 4 to the output level shifter 6a, is equal to the high voltage internal power supply VDD (Vlh=VDD), and a logic low potential Vll of such signals is equal to the low voltage internal power supply VSS (Vll=VSS).

A logic high potential Vioh of the signals, which are input from the output level shifter 6a to the I/O unit 5 and are output from the I/O unit 5 to the input level shifter 6b, is equal to the high voltage external power supply VCC (Vioh=VCC), and a logic low potential Viol of those signals is equal to the low voltage external power supply GND (Viol=GND).

The layout of FIG. 3 has the arrangement in which the I/O units 5 are disposed at the peripheral portion of the semiconductor chip CH. However, the layout of the semiconductor chip CH is not limited to this arrangement, and may alternatively be an arrangement in which the I/O units 5 are, for example, disposed in the central vicinity of the semiconductor chip CH.

Additionally, FIG. 4 is a view illustrating a circuit arrangement of the high voltage supply circuit 2.

As illustrated, the high voltage internal supply controlling unit 2b in the high voltage supply circuit 2 is constituted by transistors (power supply transistors) TP1 to TPn, each of which comprises a plurality of P channel MOSs.

These transistors TP1 to TPn are connected in parallel, wherein the high voltage external power supply VCC is connected to one connection of each of them and the high voltage internal power supply VDD is connected to the other connection thereof. Each Gate of the transistors TP1 to TPn is connected such that an internal control signal CNT1, output from the high voltage internal supply generating unit 2a of the previous stage, is inputted thereto.

Additionally, the high voltage internal supply generating unit 2a of the high voltage supply circuit 2 comprises a differential amplifier (first voltage comparing unit) 10. Although being able to adopt any arrangements, the differential amplifier 10 herein has: two differential input terminals; output terminals; and an input control terminal capable of being set to any output potentials.

In the differential amplifier 10, one of the input terminals thereof is connected such that the high reference voltage VREFh, generated by the high reference voltage circuit 8, is input thereto, and the other of the input terminals is connected such that the high voltage internal supply VDD is input thereto.

Also, the input control terminal of the differential amplifier 10 is connected such that the high voltage setting signal HSS is input therefrom, and each signal output from the output terminals of the differential amplifier 10 is output as an internal control signal CNT1.

FIG. 5 illustrates a circuit arrangement of the low voltage supply circuit 3.

The low voltage internal supply controlling unit 3b is constituted by transistors (power supply transistors) TN1 to TNn, each of which comprises a plurality of N channel MOSs. These transistors TN1 to TNn are connected in parallel, wherein the low voltage internal power supply VSS is connected to one connection of each of them, and the low voltage external power supply GND is connected to the other connection thereof.

Each Gate of the transistors TN1 to TNn is connected such that an internal control signal CNT2 output from the low voltage internal supply generating unit 3a of the previous stage is input thereto.

Also, the low voltage internal supply generating unit 3a comprises a differential amplifier (second voltage comparing unit) 11. Although being able to adopt any arrangements, similarly to the differential amplifier 10, the differential amplifier 11 herein has: two differential input terminals; output terminals; and an input control terminal capable of being set to any output potentials.

In the differential amplifier 11, one of the input terminals is connected such that low reference voltage VREFl, generated by the low reference voltage circuit 9, is input thereto, and the other of the input terminals is connected such that the low voltage internal power supply VSS is input thereto.

The input control terminal of the differential amplifier 11 is connected such that the low voltage setting signal LSS is input thereto, and a signal output from the output terminal of the differential amplifier 11 serves as an internal control signal CNT2.

Thus, when the internal operating power supply in the semiconductor integrated circuit device 1 is generated by each of the high voltage supply circuit 2 and the low voltage supply circuit 3, DC fluctuation in the consumed currents generated in the logic circuit block 4 is transmitted through the high voltage supply circuit 2 and the low voltage supply circuit 3 to the high voltage external power supply VCC and the low voltage external power supply GND, respectively.

Accordingly, since the inductance in the semiconductor integrated circuit device 1 is not directly subjected to the DC fluctuation of the consumed currents, the characteristic impedance of the power source becomes equivalently smaller, thereby allowing the reduction in low frequency noises.

Note that FIGS. 4 and 5 shows the arrangements of inputting the high reference voltage VREFh and the low reference voltage VREFl generated by the high reference voltage circuit 8 and the low reference voltage circuit 9, respectively. However, there may be adopted such an arrangement that the high reference voltage VREFh and the low reference voltage VREFl are externally input. In this case, the high reference voltage circuit 8 and the low reference voltage circuit 9 may not be provided in the semiconductor chip CH.

Figure 10:
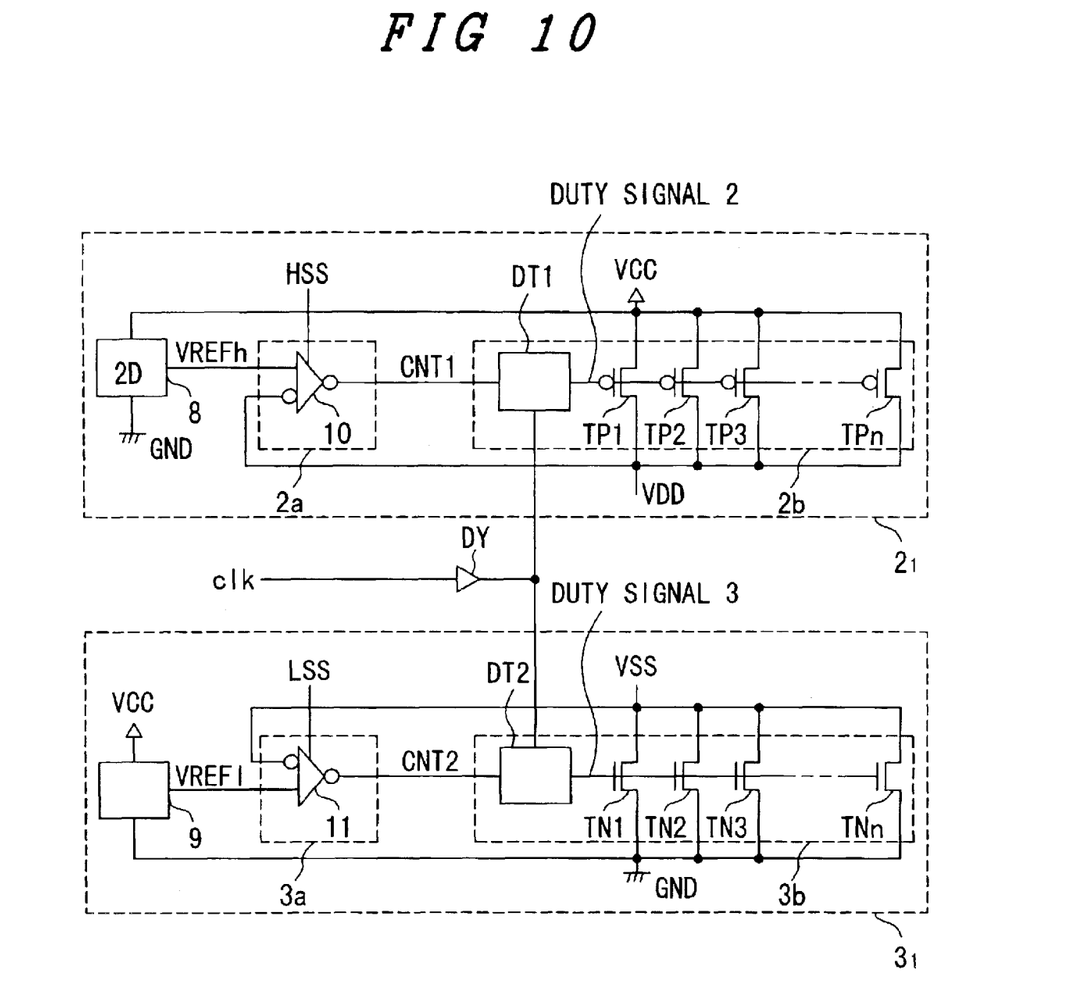
FIG. 10 is a circuit view illustrating an example of another arrangement of a high voltage supply circuit and a low voltage supply circuit provided in a semiconductor integrated circuit device according to another embodiment of the present invention.

Further, as shown in FIG. 10, there may be adopted such an arrangement that a high voltage supply circuit $2_1$ and a low voltage supply circuit $3_1$ are respectively provided with duty control circuits DT1 and DT2.

In this case, the high voltage supply circuit $2_1$ has the same circuit arrangement as the high voltage supply circuit 2 shown in FIG. 4, except the difference that the duty control circuit (first duty control circuit) DT1 is provided between the high voltage internal supply generating unit 2a and the high voltage internal supply controlling unit 2b and the high voltage internal supply controlling unit 2b is controlled through a clock clk.

Also, the low voltage supply circuit $3_1$ has the same circuit arrangement as the low voltage supply circuit 3 shown in FIG. 5, except the difference that the duty control circuit (second duty control circuit) DT2 is provided between the low voltage internal supply generating unit 3a and the low voltage internal supply controlling unit 3b and the low voltage internal supply controlling unit 3b is controlled through the clock clk.

Figure 11:
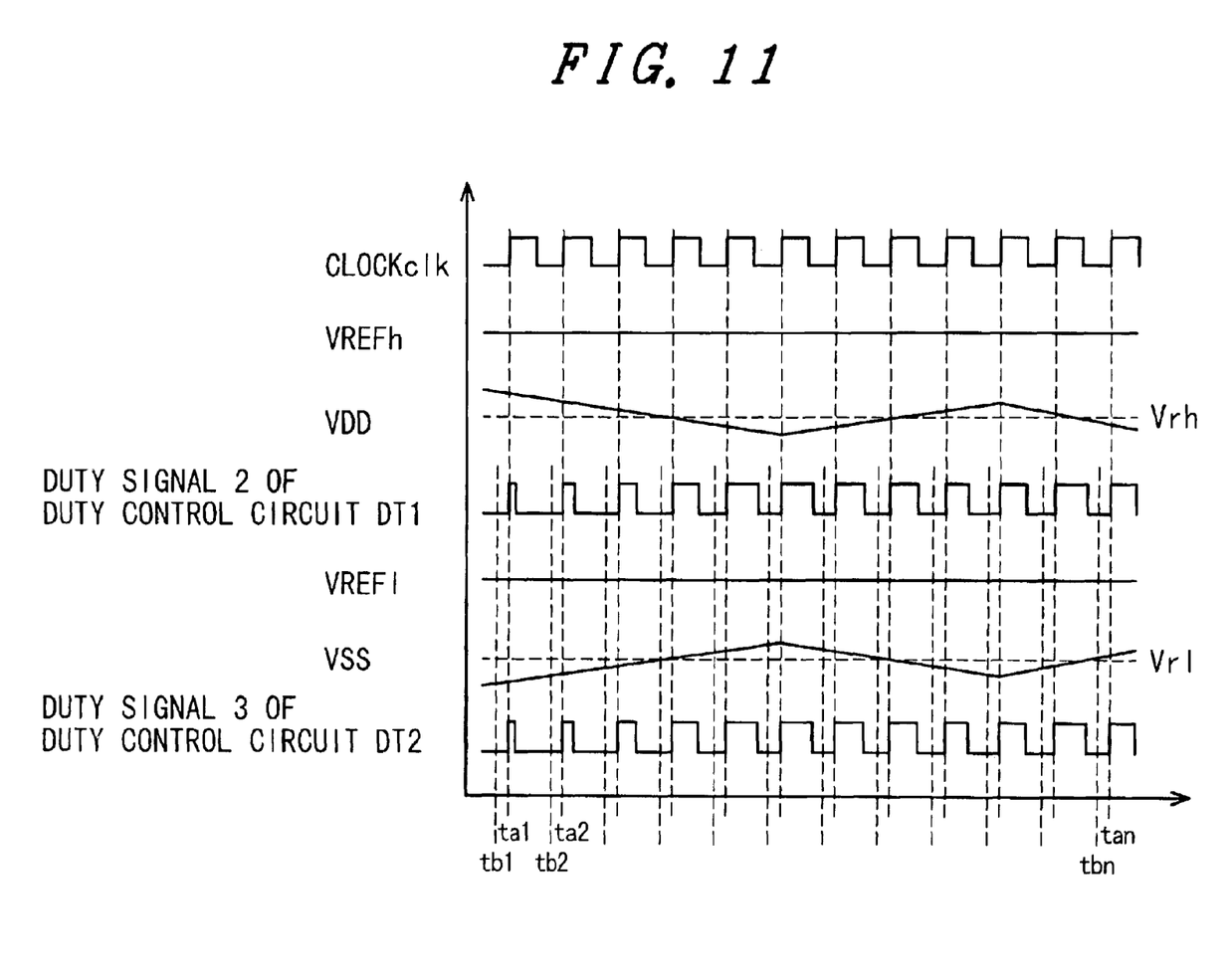
FIG. 11 is a chart of signal timings of the high voltage supply circuit and the low voltage supply circuit of FIG. 10.

FIG. 11 illustrates signal-timing charts in the high voltage supply circuit $2_1$ and the low voltage supply circuit $3_1$.

In FIG. 11, from top to bottom, there are shown the respective signal timings of: the clock clk; the high reference voltage VREFh; the high voltage internal power supply VDD; a duty signal 2 for generating the high voltage output from the duty control circuit DT1; the low reference voltage VREFl; the low voltage internal power source VSS; and a duty signal 3 for controlling the low voltage generation output from the duty control circuit DT2.

The clock clk in the logic circuit block 4 is input to the duty control circuits DT1 and DT2.

In the high voltage supply circuit $2_1$, as the potential of the internal control signal CNT1 output from the differential amplifier 10 rises, the low voltage pulse width (WL) of the duty signal in the duty control circuit DT1 becomes large to increase the time period during which the transistors TP1 to TPn are switched on.

Vice versa, when the potential of the interior control signal CNT1 descends, the high voltage pulse width (WH) of the duty signal 2 becomes large to shorten the time period during which the transistors TP1 to TPn are switched on.

Meanwhile, in the low voltage supply circuit $3_1$, when the potential of the internal control signal CNT2, output from the differential amplifier 11, rises, the high voltage pulse width of the duty signal 3 in the duty control circuit DT2 becomes large to increase the time period during which the transistors TN1 to TNn are switched on. Vice versa, when the potential of the interior control signal CNT2 descends, the low voltage pulse width of the duty signal 3 becomes large to shorten the time period during which the transistors TN1 to TNn are switched on.

If a duty ratio between the duty control circuits DT1 and DT2 is 50% (WL=WH), the gate sizes of the transistors TP1 to TPn and TN1 to TNn are set to make constant the high voltage internal power supply VDD and low voltage internal power supply VSS.

Thus, the high voltage internal power supply VDD or low voltage internal power supply VSS is increased when the duty ratio between the duty signals output from the duty control circuits DT1 and DT2 exceeds 50% (WL<WH), or the high voltage internal power supply VDD or low voltage internal power supply VSS descends when the duty ratio is less than 50% (WL>WH). Therefore, the supply voltage control of the high voltage supply circuit $2_1$ or low voltage supply circuit $3_1$ becomes a negative feedback control, whereby the high voltage internal power supply VDD and low voltage internal power supply VSS are kept constant.

Further, since each operating frequency of the duty signals is identical to the clock clk of the logic circuit block 4, at which the logic circuit is synchronously operated, noise increase due to the clock clk is suppressed, by inserting a delaying circuit DY (FIG. 10) or the like to delay or advance the switching timings for the duty signals of the duty control circuits DT1 and DT2 in comparison to the operating timing of the logic circuit block 4.

The circuit arrangement of the high reference voltage circuit 8 will further be explained.

As illustrated in FIG. 6, the high reference voltage circuit 8 comprises a transistor Tr formed of a P channel MOS, resistances R1 to R3, and a condenser C. The high voltage external power supply VCC is connected to one connection of the transistor Tr, and the gate of the transistor Tr is connected such that the high voltage setting signal HSS is input thereto.

One connection of the resistance R1 is connected to the other connection of the transistor Tr, and each one connection of the resistances R2 and R3 is connected to the other connection of the resistance R1.

The low voltage external power supply GND is connected to the other connection of the resistance R2, and one connection of the condenser C is connected to the other connection of the resistance R3. The low voltage external power supply GND is connected to the other connection of the condenser C.

Additionally, the voltage, divided by the resistances R1 and R2 through the transistor Tr, becomes the high reference voltage VREFh. The high reference voltage VREFh is output through a low pass filter constituted by the resistance R3 and the condenser C.

Since the high reference voltage VREFh is connected to a gate of the MOS transistor constituting the differential amplifier 10 of the high voltage internal supply generating unit 2a, a current hardly flows. Accordingly, by increasing the resistance value of the resistance R3 while the capacitance of the condenser C remains relatively small, it is possible to narrow the band and thus to reduce the layout area of the semiconductor device.

Note that, the circuit arrangement of the low reference voltage circuit 9 is identical to that of the high reference voltage circuit 8 as illustrated in FIG. 6, except that the low voltage setting signal LSS is input and the low reference voltage VREFl is output, and so the explanation thereof will be omitted.

FIG. 7 is a view illustrating one example in which a plurality of semiconductor integrated circuit devices 1 are mounted on a board BD, such as a printed circuit board or the like, onto which electronic components or the like are mounted.

In this case, onto the board BD, there are mounted: three semiconductor integrated circuit devices 1; a power supply circuit DCC for generating the high voltage external power supply VCC; and a power supply circuit DSS for generating the low voltage external power supply GND.

The high voltage external power supply VCC, generated by the power supply circuit DCC, is respectively supplied to each power supply terminal of the three semiconductor integrated circuit devices 1 through a power supply wire DH1 formed on the board BD.

Similarly, the low voltage external power supply GND, generated by the power supply circuit DSS, is respectively supplied to each power supply terminal of the three semiconductor integrated circuit devices 1 through a power supply wire DH2 formed on the board BD.

Further, in FIG. 7, the description has been made of one example in which the three semiconductor integrated circuit devices 1, a power supply circuit DCC, and a power supply circuit DSS are mounted on the board BD. However, although not illustrated, each reference voltage circuit for generating a high reference voltage VREFh and a low reference voltage VREFl may be mounted on the board BD.

In this case, the high reference voltage VREFh and low reference voltage VREFl generated by the reference voltage circuits are supplied to the respective semiconductor integrated circuit devices 1 through wirings formed on the board BD.

Further, the reference voltage circuits may voltage-shift the high voltage external power supply VCC and lowvoltage external power supply GND to generate the high reference voltage VREFh and low reference voltage VREFl, respectively.

When the reference voltage circuit is voltage-shifted, the voltage shift circuit can be constituted by the use of the circuit as illustrated in FIG. 6.

Additionally, the number of semiconductor integrated circuit devices 1, mounted onto the board BD, is not limited to three, and that may be two or more if being at least one. Further, for example, a plurality of reference voltage circuits may be mounted in accordance with the respective operating currents of the semiconductor integrated circuit devices 1.

Thus, when the high reference voltage VREFh and the low reference voltage VREFl are supplied to the semiconductor integrated circuit devices through wirings formed on the board BD, for example, a multilayer printed board is also used in which wirings for the high reference voltage VREFh and the low reference voltage VREFl are formed in an intermediate layer.

Then, respective power supply wire layers for the low voltage external power supply GND are formed on the upper and lower layers of the wirings, and respective power supply wire layers for the high voltage external power supply VCC are formed on the upper and lower layers of those power supply wire layers.

Also, by arranging, as plane layers (solid layers), the power supply wire layers for the low voltage external power supply GND and the high voltage external power supply VCC, it is possible to remarkably reduce noises getting on the high reference voltage VREFh and the low reference voltage VREFl.

FIG. 8 is a circuit view of the input level shifter 6b provided in the level shifter unit 6.

The input level shifter 6b comprises three inverters Iv1 to Iv3, and transistors Tr1 and Tr2. The transistor Tr1 is formed of an N channel MOS while the transistor Tr2 is formed of a P channel MOS.

An I/O unit 5 is connected to input portions of the inverters Iv1 and Iv2, and a gate of the transistor Tr1 is connected to an output portion of the inverter Iv1. A gate of the transistor Tr2 is connected to an output portion of the inverter Iv2.

These transistors Tr1 and Tr2 are connected between the high voltage external power supply VCC and the low voltage external power supply GND in a serial manner. An input portion of the inverter Iv3 is connected to output portions, to which the transistors Tr1 and Tr2 are connected in series, and the logic circuit block 4 is connected to an output portion of the inverter Iv3.

The inverters Iv1 and Iv2 are connected such that the high voltage external power supply VCC and the low voltage external power supply GND serve as operating power supplies, and the inverter Iv3 is connected such that the high voltage internal power supply VDD and the low voltage internal power supply VSS serve as operating power supplies.

Thus, since the respective operating power supplies for the inverters Iv1 and Iv2 are the high voltage external power supply VCC and the low voltage external power supply GND, the logic high voltage becomes the high voltage external power supply VCC and the logic low voltage becomes the low voltage external power supply GND.

Since the transistors Tr1 and Tr2 are clamped, the logic high voltage of the input signal of the inverter Iv3 is a value lower than the high voltage external power supply VCC by a threshold Vth of the transistor Tr1 and the logic low voltage is a value higher than the low voltage external power supply GND by a threshold Vth of the transistor Tr2.

Moreover, since the operating power supplies of the inverter Iv3 are the high voltage internal power supply VDD and the low voltage internal power supply VSS, the logic high voltage of the output signal of the input level shifter 6b becomes the high voltage internal power supply VDD and the logic low voltage becomes the low voltage internal power supply VSS.

FIG. 9 is a circuit view of the output level shifter 6a provided in the level shifter unit 6.

The output level shifter 6a comprises resistances R4 and R5, a condenser C1, a power supply circuit DP, and a plurality of differential amplifiers AP.

The resistances R4 and R5 are connected in series between the high voltage internal power supply VDD and the low voltage internal power supply VSS, and one connection of the condenser C1 is connected to each connection of the resistances R4 and R5.

A reference voltage Vref, used as a reference voltage of each differential amplifier AP, is generated through voltage division of the resistances R4 and R5. In this case, the resistance values of the resistances R4 and R5 are the same so that the reference voltage Vref becomes an intermediate voltage between the high voltage internal power supply VDD and the low voltage internal power supply VSS. The condenser C1 is a stable capacitor of the reference voltage Vref.

The power supply circuit DP generates, from the reference voltage Vref, a bias voltage Vbias serving as a bias voltage of each differential amplifier AP. The bias voltage Vbias, generated by the power supply circuit DP, is connected such that it is supplied to each of the differential amplifiers AP.

The reference voltage Vref is connected such that one input portion of each differential amplifier AP is input thereto, and the other input portion of each differential amplifier AP is connected such that the signal, output from the logic circuit block 4, is input thereto. The signal, output from the output portion of each differential amplifier AP, is output to the I/O units 5.

The operating power supplies for the differential amplifiers AP are set to the high voltage external power supply VCC and the low voltage external power supply GND. Each differential amplifier AP has a large input range in comparison to a non-complementary type differential amplifier, and is also capable of receiving the signal with small amplitude.

Accordingly, even though the high voltage internal power supply VDD is much lower than the high voltage external power supply VCC or even though the low voltage internal power supply VSS is much higher than the low voltage external power supply GND, then the relationship "VSS<Vref<VDD" is formed as long as an input signal amplitude Vin (=VDD−VSS) of each differential amplifier AP is a few in amplitude value. Therefore, the signal, output from the logic circuit block 4, can amplified up to the value of the signal amplitude of the I/O unit 5 and be output.

Next, operations of the high voltage supply circuit 2 and the low voltage supply circuit 3, provided in the semiconductor integrated circuit device 1 according to the present embodiment, will be explained.

In the high voltage supply circuit 2 as illustrated in FIG. 4, when the high voltage internal power supply VDD is higher than the high reference voltage VREFh, the high voltage internal power supply VDD is descended by raising the potential of the internal control signal CNT1 and decreasing the operating currents of the transistors TP1 to TPn.

Meanwhile, when the high voltage internal power supply VDD is lower than the high reference voltage VREFh, the high voltage internal power supply VDD is raised by descending the potential of the internal control signal CNT1 and raising the operating currents of the transistors TP1 to TPn.

Accordingly, in the high voltage supply circuit 2, a negative feedback loop L is formed by the high voltage internal supply generating unit 2a and the high voltage internal supply controlling unit 2b. If a cutoff frequency of the negative feedback loop L is set to be equal to or less than the frequency of a low frequency noise generated in the high voltage internal power supply VDD, such low frequency noise can be suppressed through the negative feedback loop L.

Further, when the semiconductor integrated circuit device 1 is in a non-operating condition such as a standby condition or the like, the potential of the internal control signal CNT1 is set to the high voltage external power supply VCC through the high voltage setting signal HSS. Thereby, the transistors TP1 to TPn is switched off and the high voltage external power supply VCC and the high voltage internal power supply VDD are electrically separated.

In this manner, since the current is hardly supplied to the logic circuit block 4, the consumed current of the semiconductor integrated circuit device 1 can be made low even if respective amounts of gate leakage current and drain leakage current of the MOS transistor itself, used in the logic circuit block 4, are large.

Further, in the low voltage supply circuit 3 as illustrated in FIG. 5, when the low voltage internal power supply VSS is lower than the low reference voltage VREFl, the low voltage internal power supply VSS is raised by descending the potential of the internal control signal CNT2 and decreasing the operating currents of the transistors TN1 to TNn.

Vice versa, when the low voltage internal power supply VSS is higher than the low reference voltage VREFl, the low voltage internal power supply VSS is descended by raising the potential of the internal control signal CNT2 and increasing the operating currents of the transistors TN1 to TNn.

Also in this case, in the low voltage supply circuit 3, a negative feedback loop L is formed by the low voltage internal supply generating unit 3a and the low voltage internal supply controlling unit 3b. When a cutoff frequency of the negative feedback loop L is set to be equal to or less than the frequency of the low frequency noise generated in the low voltage internal power supply VSS, such low frequency noise can be reduced.

Also in this case, when the semiconductor integrated circuit device 1 is in a non-operating condition such as a standby condition or the like, the potential of the internal control signal CNT2 is set to the low voltage external power supply GND through the low voltage setting signal LSS.

Therefore, the transistors TN1 to TNn are switched off and the low voltage external power supply GND and low voltage internal power supply VSS are electrically separated and the current hardly flows from the logic circuit block 4, thereby allowing the consumed current of the semiconductor integrated circuit device 1 to be made low even if the gate leakage current and drain leakage current of the MOS transistor itself, used in the logic circuit block 4, are large.

Thus, in the present embodiment, since the high voltage supply circuit 2 and low voltage supply circuit 3 are provided in the semiconductor integrated circuit device 1, it is possible to make small the inductance in the semiconductor integrated circuit device 1 and to reduce the low frequency noise.

As described above, the invention made by the present inventors has been concretely explained based on the embodiments. However, needless to say, the present invention is not limited to the above-mentioned embodiments, and can be variously modified and altered without departing from the gist thereof.

For example, the above embodiment has the structure in which the semiconductor integrated circuit device is provided with the level shifter units for performing the level shift of the input/output signals. However, it may adopt the structure in which the level shifter units are not provided if the voltage difference is hardly between the high voltage external power supply VCC/low voltage external power supply GND and the high voltage internal power supply VDD/low voltage internal power supply VSS.

Further, for example, the differential amplifier AP of the output level shifter 6a may be constituted, by a complementary type differential amplifier capable of reducing the fluctuation in output characteristics even if there are fluctuations in the reference voltage and the amplitude central voltage of the externally input signal.

Figure 12:
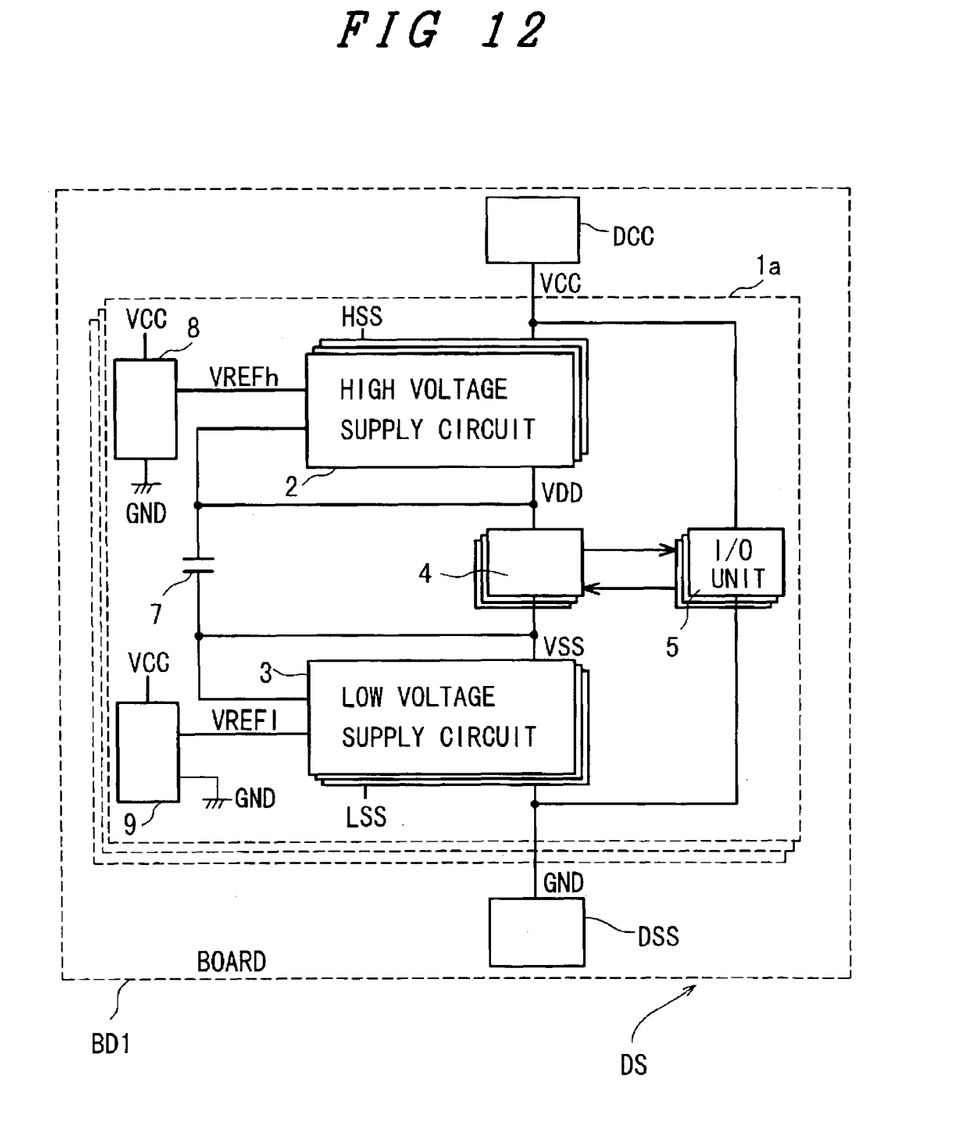
FIG. 12 is an explanatory view illustrating one example in which the semiconductor integrated circuit device according to the other embodiment of the present invention is mounted onto a board.

FIG. 12 is an explanatory view for illustrating one example of an electronic system DS having the structure in which a semiconductor integrated circuit device 1a, provided with no level shifter unit, is mounted onto a board (electronic-parts mounting board) BD1 for mounting electronic parts or the like.

The semiconductor integrated circuit device 1a is the same arrangement as the semiconductor integrated circuit device 1 (FIG. 1) except that it is provided with no level shifter unit and that the logic circuit block 4 and I/O unit 5 are directly connected.

Further, on the board BD1, for example, there are mounted: three semiconductor integrated circuit devices 1a; a power supply circuit DCC for generating the high voltage external power supply VCC and a power supply circuit DSS for generating the low voltage external power supply GND.

Additionally, the high voltage external power supply VCC and the low voltage external power supply GND, generated by the power supply circuit DCC and the power supply circuit DSS, are respectively supplied to the semiconductor integrated circuit devices 1a through the power supply wires formed on the board BD1.

Also by this, it is possible to made small the inductance in the semiconductor integrated circuit device 1a and to reduce the low frequency noise.

The effects obtained by the representative ones of the inventions disclosed in this application-will be briefly described as follows.

(1) Since noise of the low frequency band, generated during the operation, can be remarkably reduced, reliability of the semiconductor integrated circuit device can be improved.

(2) It is possible to reduce leakage currents of the logic circuit generated in a standby condition or the like, and to suppress the supply voltage drop due to the decrease in the operating supply voltages and the increase in the consumed currents.

What is claimed is:

1. A semiconductor integrated circuit device, comprising:
an internal supply generating means for generating, from an external supply voltage that is externally input, an internal supply voltage at which a logic circuit is operated;
a level shift means for shift a voltage amplitude level of a signal input to and output from said logic circuit,
wherein said internal supply generating means includes:
a high voltage supply generating unit for generating a high voltage internal power supply from a high voltage external power supply of said external supply voltage; and
a low voltage supply generating unit for generating a low voltage internal power supply from a low voltage external power supply of said external supply voltage,
in which a high voltage internal power supply and a low voltage internal power supply, generated from said high voltage supply generating unit and said low voltage supply generating unit, are used as internal supply voltages and are supplied to said logic circuit.

2. The semiconductor integrated circuit device according to claim 1,
wherein said high voltage supply generating unit includes:
a first voltage comparing unit comparing voltage levels of a first reference voltage and a high voltage internal power supply generated by said high voltage supply generating unit, and outputting a first internal control signal changing its voltage in accordance with a difference between the voltage levels; and
a first internal supply generating unit having a structure in which a plurality of power supply transistors are connected in parallel between said high voltage external power supply and said high voltage internal power supply and a first internal control signal, output by said first supply comparing unit, is input to each gate of said plurality of power supply transistors, and driving said plurality of power supply transistors in accordance with said first internal control signal to generate said high voltage internal power supply, and
wherein said low voltage supply generating unit includes:
a second voltage comparing unit comparing voltage levels of a second reference voltage and a low voltage internal power supply generated by said low voltage supply generating unit, and outputting a second internal control signal changing its voltage in accordance with a difference between the voltage levels; and
a second internal supply generating unit having a structure in which a plurality of power supply transistors are connected in parallel between said low voltage external power supply and said low voltage internal power supply and said second internal control signal, output by said second voltage comparing unit, is input to each gate of said plurality of power supply transistors, and driving said plurality of power supply transistors in accordance with said second internal control signal to generate said low voltage internal power supply.

3. The semiconductor integrated circuit device according to claim 1,
wherein said high voltage supply generating unit includes:
a first voltage comparing unit comparing voltage levels of a first reference voltage and a high voltage internal power supply generated by said high voltage supply generating unit, and outputting a first internal control signal changing its voltage in accordance with a difference between the voltage levels; and a first internal supply controlling unit provided with a first duty control circuit, which generates a pulse signal having an arbitrary duty ratio in accordance with a first internal control signal output from said first voltage comparing unit, and with a plurality of power supply transistors, which are connected in parallel between said high voltage external power supply and said high voltage internal power supply and to each gate of which a pulse signal, output from said first duty control circuit,
in which said first internal supply controlling unit generates said high voltage internal power supply by driving said plurality of power supply transistors in accordance with said pulse signal, and
wherein said low voltage supply generating unit includes:
a second voltage comparing unit comparing voltage levels of a second reference voltage and a low voltage internal power supply generated by said low voltage supply generating unit, and outputting a second internal control signal changing its voltage in accordance with a difference between the voltage levels; and
a second internal supply controlling unit provided with a second duty control circuit, which generates a pulse signal having an arbitrary duty ratio in accordance with a second internal control signal output from said second voltage comparing unit, and with a plurality of power supply transistors, which are connected in parallel between said low voltage external power supply and said low voltage internal power supply and to each gate of which a pulse signal, output from said second duty control circuit, is input,
in which said second internal supply controlling unit generates said low voltage internal power supply by driving said plurality of power supply transistors in accordance with said pulse signal.

4. The semiconductor integrated circuit device according to claim 2,
wherein said first and second voltage comparing units stopping said plurality of power supply transistors in accordance with a input setting signal, and electrically separate said high voltage external power supply and said high voltage internal power supply, as well as said low voltage external power supply and said low voltage internal power supply, respectively.

5. The semiconductor integrated circuit device according to claim 4,
wherein said high voltage supply generating unit includes:
a first transistor connected between said high voltage internal power supply and said high voltage external power supply, and conducted when said first voltage comparing unit electrically separates said high voltage external power supply and said high voltage internal power supply in accordance with a control signal, and
wherein said low voltage supply generating unit includes:
a second transistor connected between said low voltage internal power supply and said low voltage external power supply, and conducted when said second voltage comparing unit electrically separates said low voltage external power supply and said low voltage internal power supply in accordance with a control signal.

6. The semiconductor integrated circuit device according to claim 1,
wherein an ESD protection device, serving as a supply capacitor, is provided between internal supply voltages generated by said internal supply generating unit.

7. The semiconductor integrated circuit device according to claim 1,
wherein each of said first internal supply controlling unit, said second internal supply controlling unit, and said ESD protection device is provided two or more in number, thereby being dispersedly disposed on a semiconductor chip.

8. The semiconductor integrated circuit device according to claim 1,
wherein a reference voltage generating unit for generating said first and second reference voltages is provided.

9. The semiconductor integrated circuit device according to claim 1,
wherein said level shifter includes:
a first level shift unit shifting, into a signal amplitude of an external supply voltage level, a signal amplitude of an internal supply voltage level output from said logic circuit, and
a second level shift unit shifting, into a signal amplitude of an internal supply voltage level at which said logic circuit is operated, a signal amplitude of an external supply voltage level having been input externally.

10. An electronic system comprising:
a semiconductor integrated circuit device including an internal supply voltage generating means for generating, from an external supply voltage that is externally input, an internal supply voltage at which a logic circuit is operated;
an electronic component mounting board for mounting said semiconductor integrated circuit device,
wherein said internal supply voltage generating means includes:
a high voltage supply generating unit generating a high voltage internal power supply, from a high voltage external power supply of an external supply voltage supplied through a power supply wire formed on said electronic component mounting board; and
a low voltage supply generating unit generating a low voltage internal power supply, from a low voltage external power supply of an external supply voltage supplied through a power supply wire formed on said electronic component mounting board,
in which said high voltage internal power supply and said low voltage internal power supply, generated by said high voltage supply generating unit and said low voltage supply generating unit, are used as internal supply voltages and are supplied to said logic circuit.

11. The electronic system according to claim 10,
wherein said high voltage supply generating unit includes:
a first voltage comparing unit comparing voltage levels of a first reference voltage and a high voltage internal power supply generated by said high voltage supply generating unit, and outputting a first internal control signal changing its voltage in accordance with a difference between the voltage levels; and
a first internal supply controlling unit having a structure in which a plurality of power supply transistors are connected in parallel between said high voltage external power supply and said high voltage internal power supply and said high voltage internal power supply and a first internal control signal, output by said first voltage comparing unit, is input to each gate of said plurality of power supply transistors, and driving said plurality of power supply transistors in accordance with said first internal control signal to generate said high voltage internal power supply, and
wherein said low voltage supply generating unit includes:
a second voltage comparing unit comparing voltage levels of a second reference voltage and a low voltage internal power supply generated by said low voltage supply generating unit, and outputting a second internal control signal changing its value in accordance with a difference between the voltage levels; and
a second internal supply controlling unit having a structure in which a plurality of power supply transistors are connected in parallel between said low voltage external power supply and said low voltage internal power supply and said second internal control signal, output by said second voltage comparing unit, is input to each gate of said plurality of power supply transistors, and driving said plurality of power supply transistors in accordance with said second internal control signal to generate said low voltage internal power supply.

* * * * *